(12) United States Patent
Dea

(10) Patent No.: US 8,487,605 B1
(45) Date of Patent: Jul. 16, 2013

(54) GLOBAL SEVERE LIGHTNING STORM LOCATOR

(75) Inventor: Jack Y. Dea, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 300 days.

(21) Appl. No.: 13/151,526

(22) Filed: Jun. 2, 2011

(51) Int. Cl.
*G01R 31/02* (2006.01)

(52) U.S. Cl.
USPC .............................. 324/72; 324/260; 324/244

(58) Field of Classification Search
None
See application file for complete search history.

(56) References Cited

U.S. PATENT DOCUMENTS

| | | | |
|---|---|---|---|
| 4,724,390 A * | 2/1988 | Rauscher et al. | 324/344 |
| 4,996,473 A * | 2/1991 | Markson et al. | 324/72 |
| 2007/0088504 A1 | 4/2007 | Jantunen et al. | |
| 2008/0122424 A1* | 5/2008 | Zhang et al. | 324/72 |

OTHER PUBLICATIONS

Ibrahim, et al., An overview of Pekan lightning detection system (PLDS), Ieee Trans. on Power and Energy, Dec. 2-5, 2012, p. 718-723.*

* cited by examiner

*Primary Examiner* — Thomas Valone
(74) *Attorney, Agent, or Firm* — Kyle Eppele; J. Eric Anderson

(57) ABSTRACT

A real time Schumann frequency (approximately 6-10 Hz) band-based, lightning strike detector system is described, comprising: first and second sensor systems, each sensor system comprising: first and second magnetic field sensors, each sensor having a preferential directional sensitivity, wherein the sensors are arranged with their preferential directional sensitivity substantially orthogonal to each other; signal lines coupled to the sensors; an amplifier to coupled to the signal lines; an output of the amplifier coupled to a processor; and power source coupled to the amplifier and processor, wherein the first and second sensor systems are separated from each other by at least 400 miles, and wherein each sensor system upon detection of a Schumann frequency from a lightning strike provides a respective orientation angle, wherein an intersection of the angles of orientation following a great circle path indicates a location of the lightning strike.

14 Claims, 4 Drawing Sheets

GLOBAL SEVERE LIGHTNING STORM LOCATOR

FEDERALLY-SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone 619-553-2778; email: T2@spawar.navy.mil. Reference Navy Case No. 100,595.

BACKGROUND

This disclosure relates generally to the field of lightning detection. More particularly, this disclosure relates to a simple apparatus and method for globally detecting lightning.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

In one aspect of the disclosed embodiments, a Schumann frequency band-based, lightning strike detector system is provided, comprising: first and second systems, each system comprising: first and second magnetic field sensors, each sensor having a preferential directional sensitivity, wherein the first and second sensors are arranged with their preferential directional sensitivity substantially orthogonal to each other; signal lines coupled to the first and second sensors; an amplifier to coupled to the signal lines; an output of the amplifier coupled to a processor; and a power source coupled to the amplifier and processor; wherein the first and second systems are separated from each other by at least four hundred miles, and wherein each system upon detection of a Schumann wave from a lightning strike provides a respective orientation angle, wherein an intersection of the angles of orientation in a great circle path indicates a location of the lightning strike.

In another aspect of the disclosed embodiments, a method for detecting lightning strikes is provided, comprising: displacing first and second detector systems at least four hundred (400) miles from each other, wherein each detector system is formed by: arranging a pair of magnetic field sensors, having a preferential directional sensitivity, with their preferential directional sensitivity substantially orthogonal to each other; amplifying a sensor-detected Schumann frequency signal from each detector system; determining if the detected signals represent a lightning strike based on an amplitude threshold comparison and correlation coefficient, and upon indication of a lightning strike; determining a first angle of origin of the lightning strike from the first detector system; determining a second angle of origin of the lightning strike from the second detector system; and determining an intersection point between the first and second angle of origins following a great circle path to arrive at a location of the lightning strike.

DETAILED DESCRIPTION

In the context of this description, the term "lightning" refers to the commonly known weather phenomena of charged particles in the atmosphere being discharged in a brief instance. The term lightning strike, stroke, bolt, and so forth are understood to be descriptive terms that convey the same principle physical phenomena. Therefore, these terms may be interchanged without loss of generality.

There are currently three (3) well used related art methods for detecting lightning. The first related art method uses an electric field mill as a lightning detector. The electric field mill has rotating vanes that chop the ambient atmospheric electric field to measure its direct current/voltage (DC) value. A nearby lightning strike will induce a spike in the DC value. The detection range is around twenty four miles.

The second related art method for detecting lightning is via detection of the lightning's very low frequency (VLF) signals which are known to be anywhere in the frequency range of 3 kHz to 30 kHz. The range of detection for this method is up to 300 miles. Since signals come from small to large lightning strikes, it is difficult to differentiate between lightning strikes of different sizes, as well as interference from non-lightning VLF emitters.

The third related art method is via satellite monitoring using either optical counters or radio frequency (RF) counters. The range is limited to the line of view path and view window of the satellite. Obviously, this method entails a significant commitment of resources and is very expensive to maintain. Despite these various methods, none of the above approaches can deliver real time global monitoring of large lightning strikes.

As disclosed below, the exemplary system(s) and method(s) are elegant in their design and demonstrate a significant cost reduction over currently used lightning detectors/systems. For example, various aspects of the exemplary system(s) and method(s) described herein provide for at least two detection sites, each site having a first directional sensor in a fixed orientation and a second directional sensor in a substantially fixed orientation orthogonal to the first directional sensor. If the sensors are magnetic field detectors, each will receive magnetic field disturbances arising from lightning activity. Since it is known that lightning generates pulses in the Schumann resonance band (approximately 6-10 Hz), sensors that can detect and measure these frequencies can be used as lightning detectors. By combining two systems of sensors, a location capability can be obtained by arranging the sensors in a substantially orthogonal arrangement and processing the vector intersection of their detected signals, resulting in the rapid global location of lightning strikes.

Figure 1:
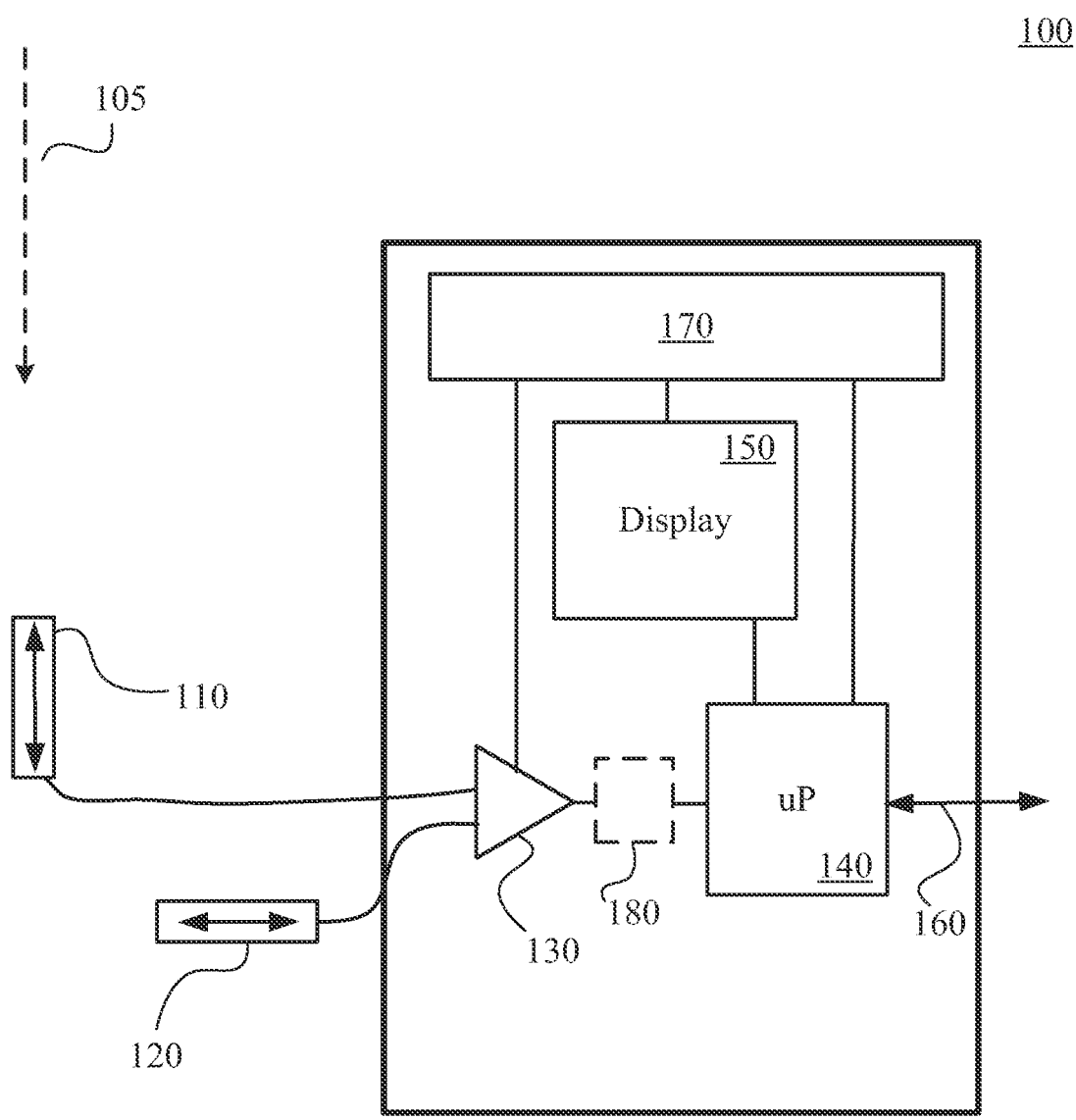
FIG. 1 is an illustration of an exemplary detector system.

FIG. 1 is an illustration of an exemplary induction-based sensor monitoring system 100. Two (2) substantially orthogonally arranged sensors 110, 120 can be used to provide vector information for a detected signal. Each sensor 110 (120) is arranged to have a direction of sensitivity that is orthogonal to the complementary sensor's 120 (110) direction of sensitivity, so as to provide vector component-like addition of a detected signal to arrive at the signal direction. For example, in this FIG. 1, sensor 110 is oriented in a north-south axis while sensor 120 is oriented in a west-east axis. In this arrangement, a signal 105 (e.g., lightning strike) emanating directly from the north-south axis (either from the north or from the south of sensor 120) will cause sensor 120 to register a high detection value while sensor 110 (being substantially orthogonal to the signal 105) will register none to nearly no signal. This "vector" approach indicates that the originating signal 105 is originating at an orientation angle entirely from either the north or the south direction. By positioning two (2) such exemplary systems 100 apart from each other and finding the intersection of the detected orientation angles, this ambiguity of direction can be simply resolved. Of course, it is understood under orthogonality principles that the actual direction chosen is not as important an issue as ensuring that the sensors are placed substantially orthogonal to each other. Therefore, while FIG. 1 illustrates a north-south (south-north) vs. west-east (east-west) direction, other orientations that are orthogonal may be contemplated.

Continuing, FIG. 1 also illustrates sensors 110, 120 connected to amplifier 130, which is connected to microprocessor 140. Microprocessor 140 is connected to display 150. Amplifier 130 operates to amplify the signals from sensors 110, 120 which are forwarded for processing by microprocessor 140 and then displayed on display 150. Power supply (from mains, battery, solar, etc.) 170 is shown as providing power to the respective devices. In operation, the microprocessor 140 processes the signal value received from the amplifier 130 (the amplifier 130 may be frequency sensitive, thus negating the need for a band-pass filter) to detect the Extremely Low Frequency (ELF) waves within the Schumann band resulting from a lightning strike.

A first criterion for lightning reception is that a threshold value may be established within the microprocessor 140, for ambient/noise rejection, wherein if the signal exceeds this threshold value, then this is indicative of a lightning strike. A second criterion is that there is strong correlation between the signals from the first and second systems as determined by a preset correlation coefficient in the microprocessor 140. This provides confirmation that an actual lightning strike of sufficient magnitude is detected.

Given the system shown in FIG. 1, it should be apparent to one of ordinary skill in the art that various modifications and changes may be made to the type of devices uses, arrangement, and so forth, without departing from the scope and intent of this disclosure. For example, as with any electrical system, filtering devices, digital-to-analog converters (DAC), analog-to-digital converters (ADC), as well as additional amplifiers and so forth, may be used. These elements are indicated in FIG. 1 by optional element 180. It should be noted that the location of element 180 may vary depending on design implementation. Also, it should be apparent that sensors 110, 120 may convey their signals to amplifier 130 and/or microprocessor 140 using wireless means, as according to design preference. Microprocessor 140 can also receive and send via link 160 remote signals from other sensors (not shown) and/or other or microprocessors from other sites, etc.

FIG. 1 embodies what is believed to be the simplest and most cost effective configuration for a single exemplary lightning detector system 100. It should be appreciated that more complicated systems as well as variations of the current system 100 can be developed, utilizing the principles described herein. For example, an array of sensors may be utilized rather than utilizing a single set of substantially orthogonal sensor pairs. Further, the microprocessor 140 may have outputs connected to a speaker and the display 150 may be optional.

Figure 2:
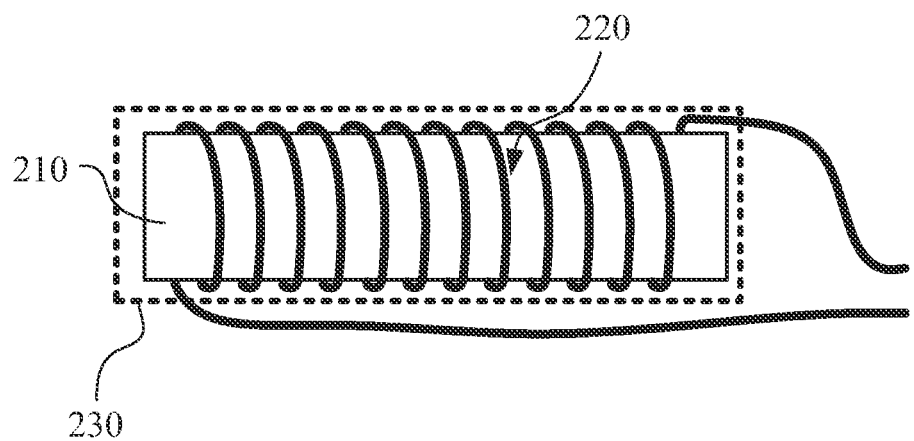
FIG. 2 is an illustration of an exemplary magnetometer-based detector.

FIG. 2 is an illustration of an exemplary magnetic field-based detector 200 suitable for use in the exemplary embodiment 100 shown in FIG. 1. In its simplest form, magnetic field-based detector 200 can be a multi-turn induction coil magnetometer, which in known to be sensitive to magnetic field. Core 210 can be made of a high permeability material and the number of turns 220 can range from up to several hundred thousand turns, depending on performance requirements. The outer case 230 may be made of a non-magnetic material so as to provide a water-proof seal, in order to keep damaging moisture out.

A high permeability ($\mu$) material core 210 gives the magnetometer 200 a much larger capture cross section than an air core coil. Of course, an air core coil may be utilized but for practical purposes it is known that the high permeability core 210 (one example of such a material is ferromagnetic material) can increase the capture cross section by a factor of one hundred or more. Therefore, a high permeability core 210 can increase the sensitivity of the detector 200.

Orientation and number of layers of the turns 220 is a design preference, therefore, various modifications may be contemplated. For example, a toroidally shaped core may be utilized. It is also understood that the choice of the number of turns, length and type of materials used in the detector 200 should be configured so as to lend the detector 200 a high sensitivity to Schumann resonance band signals. Since these "material" factors are variable, one of ordinary skill in the art may devise different turn numbers for a given core type/length, etc., resulting in different detector 200 forms, having the same performance profile. As one of many possible examples, a shorter core 210 can be compensated for by increasing the number of turns 220, or by using a higher permeability material. In one experimental version, a 90,000 turn detector was fabricated and tested, demonstrating its capability to detect lightning.

It should be noted that while FIG. 2 shows a magnetic field-based detector 200 in the form of a magnetometer, other detectors that are capable of detecting magnetic field variations (and its dual—electric field) may be used without departing from the spirit and scope of this disclosure. For example, the magnetometer is understood to be a form of an antenna. Therefore, other types of antennas that are sensitive to the Schumann resonance frequencies may be utilized.

It is understood that the exemplary detector 200 can provide increased sensitivity when it buried slightly under ground, the reduction of mechanical vibrations in a buried sensor (as opposed to an unburied sensor) results in a reduction of noise induced signals.

Figure 3:
FIG. 3 is an illustration of an exemplary operation of the global lightning detector system.

FIG. 3 is an illustration of a sample implementation of the exemplary systems in the United States. At least two sites are required for resolving location ambiguity and determining the great circle path intersection of the detected lightning. In this example, one site 310 is designated here as being located in the Pacific Northwest and the other site 320 in Southern California. Obviously, the locations are not important as much as they are displaced from each other to enable sufficient resolution of the intersecting vectors. Accordingly, other locations in other states or countries may be utilized. The example shown here indicates that the two vector signals from the individual sites 310, 320 converge in Florida 330.

In various embodiments, it is perceived that at least a minimum separation distance of around four hundred (400) miles be maintained between two exemplary systems. It should be appreciated, that with any directionally sensitive system, the respective accuracy of the overall global lightning detection system is understood to be a function of the detector sensitivity, and also arrangement and distance of the respective sites with respect to each other. Accordingly, while 400 miles is seen as a reasonable separation distance, it is understood that larger separation distances will result in higher location accuracy, provided that the individual detectors are capable of detecting signals beyond the larger separation distance. Therefore, highly accurate global coverage can be obtained by placing several of these sites on various continents as far as possible from each other. Since the exemplary embodiments are simple in design and can be built with inexpensive components, the possibility of a global lightning detector system can be easily realized.

Figure 4:
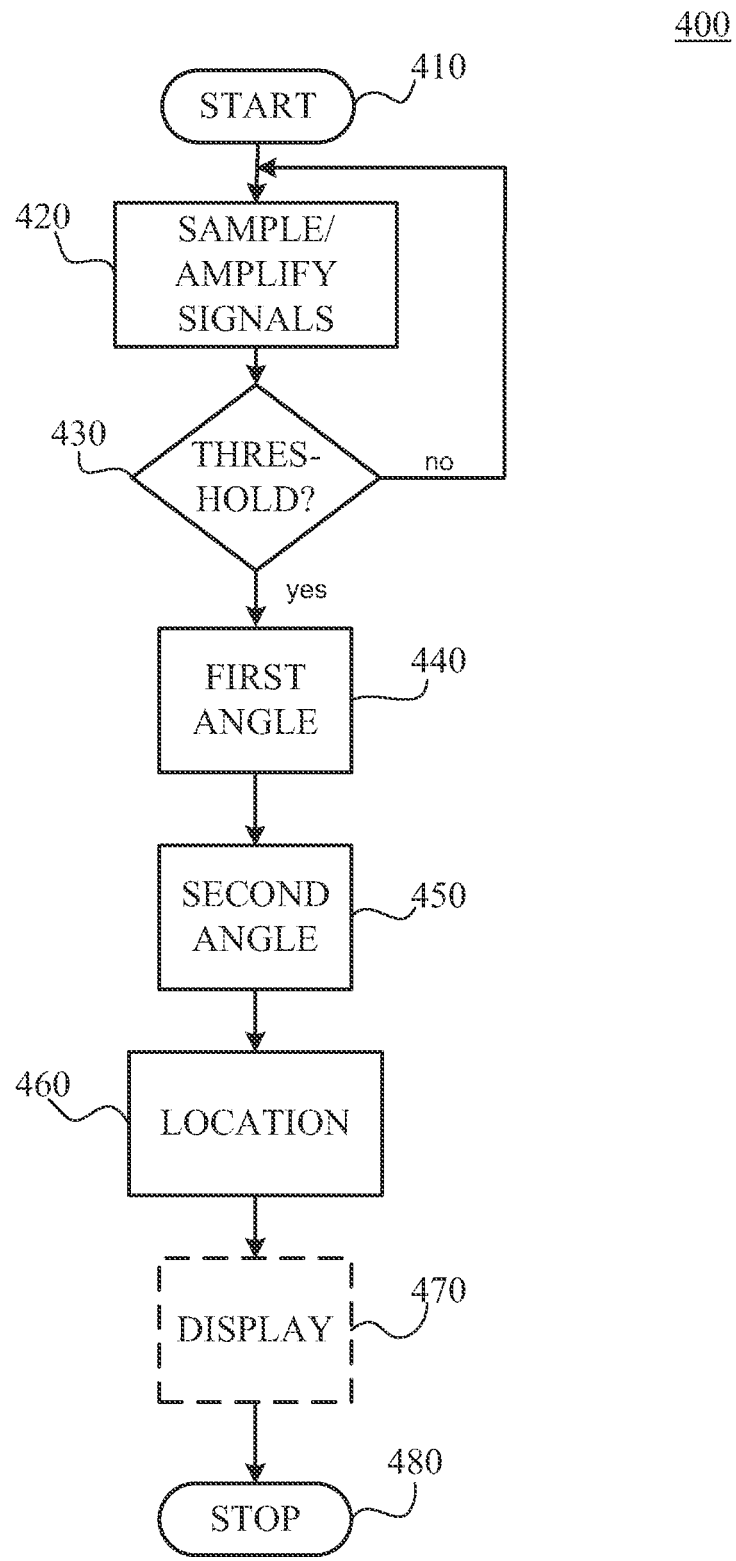
FIG. 4 is a flow chart illustrating an exemplary process for detecting lightning.

FIG. 4 is a flow chart showing an exemplary process 400 for lightning strike detection, utilizing at least two (2) exemplary detector systems disclosed herein. The exemplary process 40 begins 410 with a detected signal (within the Schumann band) being amplified 420. The signal is then forwarded to a threshold determiner 430 (e.g., microprocessor) to determine if the signal's amplitude is sufficiently high to signify a lightning strike. If it is determined that the signal is not high enough to constitute a lightning strike, the exemplary process 400 returns to another sampling/detection cycle 420. If the signal has a high enough amplitude and a strong enough correlation coefficient to signify a lightning strike, the exemplary process 400 proceeds to determining the signals' angles, with the "first" angle 440 being determined from the first detector system, and the "second" angle 450 determined from the second detector system. The combined angles form an intersection point on a geographical overlay, to indicate the location 460 of the lightning strike. Subsequent to determination of the location 460, the exemplary process 400 may terminate 480 or the location information can be forwarded to an outside user or provided via an optional display 470.

The exemplary global lightning location system(s) disclosed herein have several advantages over the related art approaches. All the related art methods are limited in range, up to 24 miles for the field mill, up to 300 miles for the VLF sensor, and limited to window view for satellites. On the other hand, the exemplary embodiments, when appropriately situated, are able to monitor, in real time, large lightning strikes around the globe. Another advantage is that unlike the related art VLF method, the exemplary embodiments being tailored to a lower frequency will not be subject to VLF signal interference (VLF being a "busy" communication frequency range).

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Therefore, it will be understood that many additional changes in the details, materials, steps and arrangement of parts, which have been herein described and illustrated to explain the nature of the disclosure, may be made by those skilled in the art within the principal and scope of the disclosure as expressed in the appended claims.

What is claimed is:

1. A Schumann frequency band-based, lightning strike detector system, comprising:
   first and second sensor systems, each sensor system comprising:
      first and second magnetic field sensors, each sensor having a preferential directional sensitivity, wherein the first and second sensors are arranged with their preferential directional sensitivity substantially orthogonal to each other;
      signal lines coupled to the first and second sensors;
      an amplifier to coupled to the signal lines;
      an output of the amplifier coupled to a processor; and
      a power source coupled to the amplifier and processor;
   wherein the first and second sensor systems are separated from each other by at least four hundred miles, and wherein each sensor system upon detection of a Schumann wave from a lightning strike provides a respective orientation angle, wherein an intersection of the angles of orientation in a great circle path indicates a location of the lightning strike.

2. The lightning strike detector system of claim 1, further comprising a Schumann frequency band pass filter coupled between the amplifier and microprocessor.

3. The lightning strike detector system of claim 1, further comprising an analog-to-digital converter coupled between the amplifier and microprocessor.

4. The lightning strike detector system of claim 1, further comprising a display coupled to an output of the microprocessor.

5. The lightning strike detector system of claim 1, wherein the magnetic field sensors are magnetometers.

6. The lightning strike detector system of claim 5, wherein the magnetometers are high permeability core, wire wound magnetometers.

7. The lightning strike detector system of claim 5, further comprising a water-proof casing around the magnetometers.

8. The lightning strike detector system of claim 1, further comprising a wireless connection between processors of the first and second systems.

9. A method for detecting lightning strikes, comprising:
   displacing first and second detector systems at least four hundred (400) miles from each other, wherein each detector system is formed by:
   arranging a pair of magnetic field sensors, having a preferential directional sensitivity, with their preferential directional sensitivity substantially orthogonal to each other;
   amplifying a sensor-detected Schumann frequency signal from each detector system;

determining if the detected signals represent a lightning strike based on an amplitude threshold comparison and correlation coefficient, and upon indication of a lightning strike;

determining a first angle of origin of the lightning strike from the first detector system;

determining a second angle of origin of the lightning strike from the second detector system; and determining an intersection point between the first and second angle of origins following a great circle path to arrive at a location of the lightning strike.

10. The lightning strike detector method of claim 9, further comprising displaying the location of the lightning strike to a user and storing the display in memory for future recall.

11. The lightning strike detector method of claim 9, further comprising sealing the sensors with a water-proof casing.

12. The lightning strike detector method of claim 11, further comprising burying the sensors in the ground.

13. The lightning strike detector method of claim 9, further comprising sending information on the first angle of origin to the second detector system.

14. The lightning strike detector method of claim 13, wherein the information is sent wirelessly.

* * * * *